United States Patent [19]

Löhr et al.

[11] Patent Number: 5,282,717
[45] Date of Patent: Feb. 1, 1994

[54] APPARATUS FOR STORING AND TRANSPORTING PRINTED CIRCUIT BOARDS

[75] Inventors: Günter Löhr, Wiernsheim; Josef Mozzi, Unterreichenbach; Gunter Herrmann, Calw, all of Fed. Rep. of Germany

[73] Assignee: Lohr & Herrmann GmbH, Neuhausen, Fed. Rep. of Germany

[21] Appl. No.: 914,899

[22] Filed: Jul. 16, 1992

[30] Foreign Application Priority Data

Aug. 1, 1991 [DE] Fed. Rep. of Germany ....... 4125496

[51] Int. Cl.$^5$ .............................................. B65B 5/10
[52] U.S. Cl. .................... 414/798.2; 211/46; 198/803.13; 414/798.5
[58] Field of Search ................... 198/803.13; 414/331, 414/798.5, 789.5, 280; 211/46

[56] References Cited

U.S. PATENT DOCUMENTS

| | | |
|---|---|---|
| 2,019,090 | 10/1935 | Pepper .................................. 211/46 |
| 3,731,823 | 5/1973 | Goth .................................... 414/331 |
| 4,236,858 | 12/1980 | Hoese et al. ......................... 414/331 |
| 4,390,093 | 1/1983 | Chard, Jr. et al. ............. 198/803.13 |
| 4,479,300 | 10/1984 | Savage ............................. 414/789.5 |
| 4,723,652 | 2/1988 | Rich ................................ 198/803.13 |
| 4,744,709 | 5/1988 | Hertel et al. ......................... 414/21 |
| 5,046,911 | 10/1991 | Ogura et al. ......................... 414/331 |
| 5,213,196 | 5/1993 | Wolf ................................. 198/803.13 |

FOREIGN PATENT DOCUMENTS

| | | |
|---|---|---|
| 3539959 | 10/1987 | Fed. Rep. of Germany . |
| 9017733 | 2/1992 | Fed. Rep. of Germany . |
| 258008 | 12/1985 | Japan ................................... 414/331 |
| 36235 | 2/1987 | Japan ............................... 414/789.5 |
| 282009 | 11/1988 | Japan ................................... 414/331 |

*Primary Examiner*—Michael S. Huppert
*Assistant Examiner*—Gregory A. Morse
*Attorney, Agent, or Firm*—Dvorak and Traub

[57] ABSTRACT

An apparatus for storing and transporting printed circuit boards is disclosed. The apparatus comprises a body having a base defining an upwardly facing support surface for supporting a stack of printed circuit boards. The support surface may optionally have a slight rearward inclination. Elongate annular members are secured to the base on both sides and extend adjacent to the supporting surface and remotely therefrom in the direction in which the stack of printed circuit boards is to be arranged. Liners are provided with holes through which the annular members extend so that the liners are movable between a suspended stand-by position to an operative position in which the liners are horizontally supported on or are vertically suspended between adjacent printed circuit boards. Two symmetrically arranged synchronized belt drives are mounted on the base and comprise belts extending parallel to elongate annular members. Each belt defines an elongate hole, which is similar to and registers with the elongate hole defined by the adjacent annular members. Each of the belt drives comprises a rotating gripper having two gripping jaws, each of which is pivotally movable by a stationary actuator. Sensors automatically position the grippers near one of the liners regardless of the position of the liner.

9 Claims, 6 Drawing Sheets

APPARATUS FOR STORING AND TRANSPORTING PRINTED CIRCUIT BOARDS

BACKGROUND OF THE INVENTION

This invention relates to an apparatus for storing and transporting printed circuit boards. The apparatus comprises a magazine having a base with an upwardly facing supporting surface for supporting a stack of superimposed or juxtaposed printed circuit boards, and a back rising from the base with a slight rearward inclination.

In a known apparatus or magazine for storing and transporting printed circuit boards, elongate annular members are secured to a base or back or both sides and extend adjacent to a supporting surface remotely therefrom in the direction in which a stack of printed circuit boards may be arranged. Liners having holes through which the annular members extend are movable between a stand-by position in which the liners are suspended and an operative position in which the liners are horizontally supported or vertically suspended between adjacent printed circuit boards. The liners are fixedly secured to the magazine. The operations by which the magazine is loaded with the printed circuit boards requires that the liners be moved from their stand-by position to their operative position in alternation so that each liner is disposed between two adjacent printed circuit boards. To unload the magazine, the loading operation is performed in a reverse sequence.

SUMMARY OF THE INVENTION

It is an object of the present invention to provide an improved apparatus or magazine for storing and transporting printed circuit boards so that the liners can be moved between their stand-by and operative positions automatically rather than manually. As a result, the cost of handling the printed circuit boards will be decreased and the cleanliness of the surfaces of the printed circuit boards will be improved. It has been suggested to automatically load and unload printed circuit boards to and from a magazine which is not provided with liners.

In accordance with the objects of the present invention two symmetrically arranged belt drives operating in synchronism are mounted on the base and include belts extending parallel to the elongate annular members. The belts operate along respective paths each of which defines an elongate hole which is similar to and registers with the elongate hole defined by the adjacent annular members. Each of the belt drives comprises a gripper to rotate the belt. Each of the belt drives comprises two gripping jaws, each of which is pivotally movable by a stationary actuator out of a path which intersects the liners. Sensors automatically position the grippers near one of the liners regardless of the position of the liners.

The magazine thus comprises two frames which are symmetrically mounted on the support for stacking printed circuit boards. Each of the frames is provided at one end with a belt drive comprising a flexible belt to which a pair of grippers are secured to rotate with the belt. Each belt defines an elongate hole, which is similar in shape to the elongate hole defined by one of the elongate annular members which are mounted on the magazine and guide the liners between a stand-by position and an operative position.

The gripping jaws of each gripper extend toward the liner and the grippers are individually pivoted to avoid obstruction by the liners as the grippers move toward a liner which is in its stand-by or operative position. The gripping jaws of each gripper can be pivotally moved to an inoperative position by means of actuators which are fixed adjacent to the leading liners which are in their stand-by or operative position. As long as the grippers are moved by the belt to move a liner between its stand-by and operative positions, the grippers are in operative positions which extend into paths which intersect the liners. The grippers are held in the operative position by springs.

It may be necessary for the grippers to engage the liners at different positions due to the number of printed circuit boards stacked in the magazine. The grippers are therefore provided with two or more sensors which are responsive to the approach of the grippers to a leading liner. The sensors generate a signal which is utilized to stop the belt drive and the grippers as the grippers approach the leading liner. If the sensors and actuators are provided in a suitable number, the grippers can be stopped in a position in which they are spaced only by a fraction of a millimeter from the incidental position of the leading liner which is in a stand-by or operative position.

After the grippers have been stopped close to the leading liner, the grippers are moved into the paths which intersect the leading liner to positively or frictionally engage the adjacent liner from two sides of a carrying bar of the liner. For that purpose the two jaws of each gripper are separated by a gap in which the carrying bar of the adjacent liner is received. The carrying bars are formed with laterally offset ribs or spacers so that the gripping jaws will not collide with a carrying bar of a liner which succeeds the leading liner as the gripper is moved to its operative position.

These and other objects, features and advantages of the present invention will become apparent upon consideration of the following Detailed Description of the Preferred Embodiments and the accompanying Drawings described below.

DETAILED DESCRIPTION OF THE PREFERRED EMBODIMENTS

Figure 1:
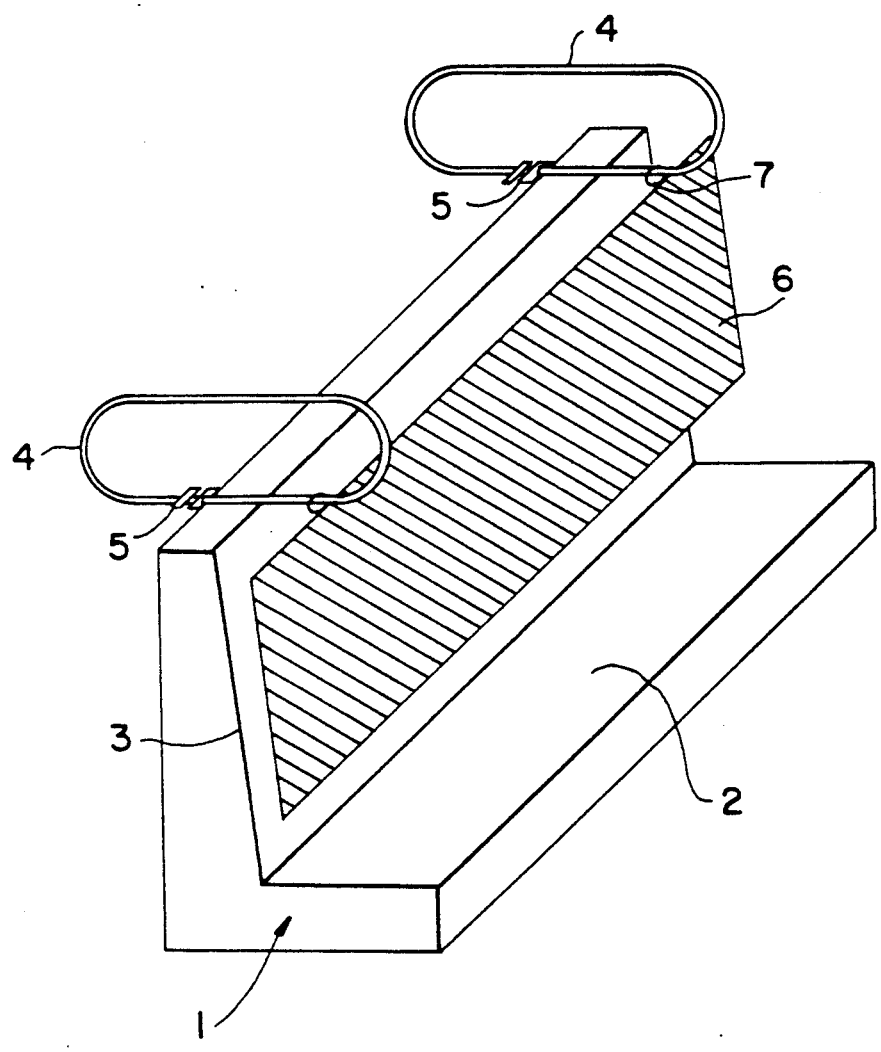
FIG. 1 is a perspective view showing a prior art magazine with one liner.

In the embodiment shown in FIG. 1 a body 1 of a magazine includes an angle member and comprises a base defining a supporting surface 2 and a back 3 which rises from the base with a slight rearward inclination. A plurality of elongate annular members 4 are secured to the back 3 on both sides thereof. Each of the annular members 4 is made of smooth round wire that is split to define a gap for receiving an eyelet 7 provided at a top edge of each of a plurality of liners 6. Each of the annular members 4 is provided with a fastener 5 for closing the gap. In the embodiment shown in FIG. 1 the elongate annular members 4 extend horizontally in the direction in which the printed circuit boards standing on edge on the supporting surface 2 are to be stacked. The elongate annular members 4 horizontally protrude from the back 3 over the supporting surface 2 and from a second surface, which is remote from the supporting surface 2. In a different embodiment, the printed circuit boards are vertically stacked on the supporting surface of the base and in that case the elongate annular members extend vertically.

Figure 2:
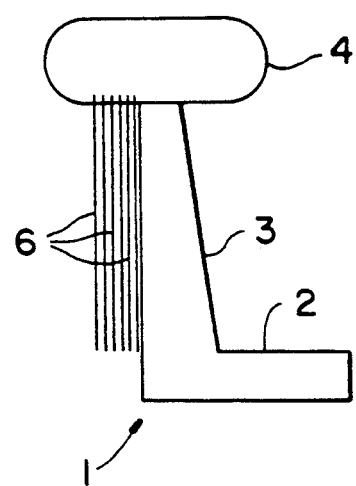
FIG. 2 is a schematic side elevation showing the magazine of FIG. 1, which is empty and in which several liners are in a stand-by position.
Figure 3:
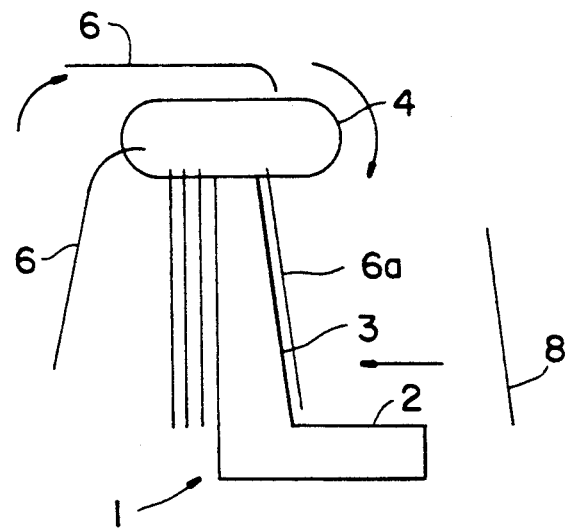
FIG. 3 is a schematic side elevation showing the magazine of FIG. 1 as a liner is moved from its stand-by position to its operative position.
Figure 4:
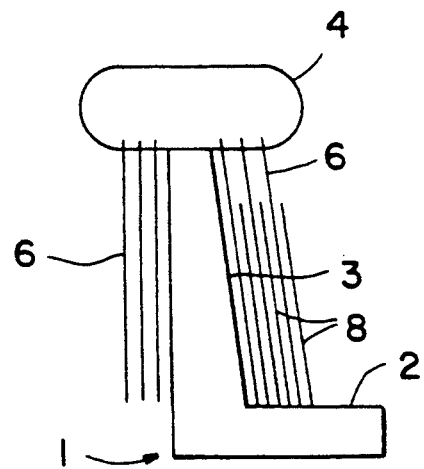
FIG. 4 is a schematic side elevation showing the partly loaded magazine of FIG. 1 with some liners in a stand-by position and some liners in an operative position.
Figure 5:
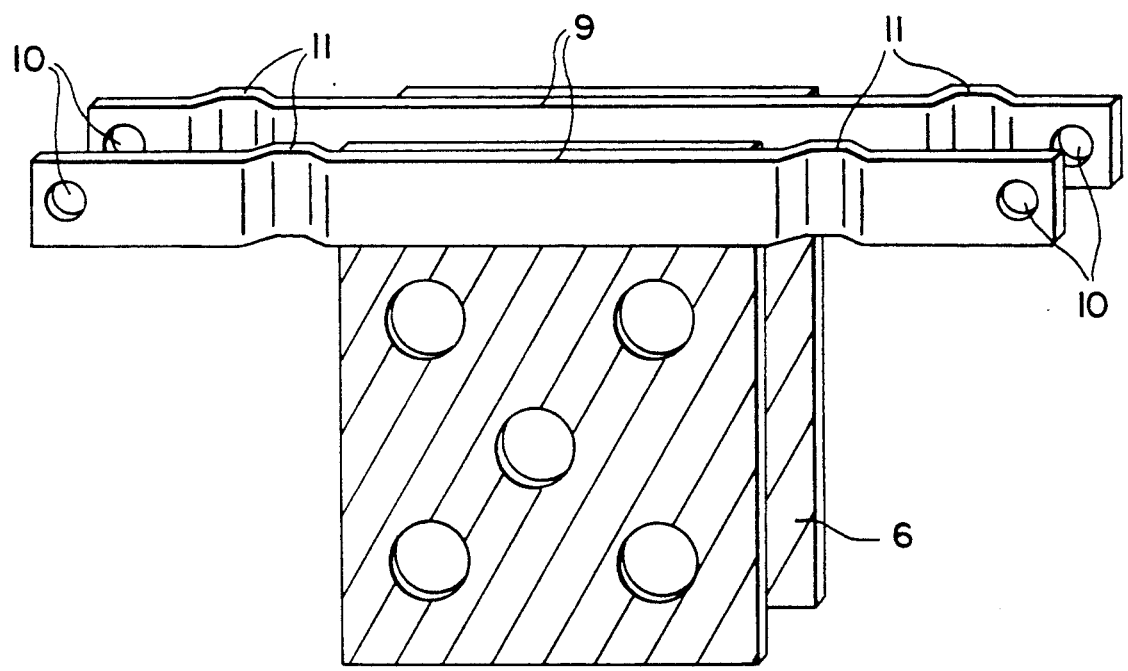
FIG. 5 is a perspective view showing a liner of the magazine of FIG. 1.

FIG. 2 shows an empty magazine provided with a plurality of liners 6 which are suspended from the annular member 4 on a side of the back 3 which is remote from the supporting surface 2. FIG. 3 illustrates how the liners 6 are turned from their stand-by position to their operative position. FIG. 3 also shows a liner 6a which has been turned to its operative position and schematically illustrates how a printed circuit board 8 is inserted into the magazine. FIG. 4 shows how the printed circuit boards 8 stacked on the supporting surface 2 alternate with liners 6. FIG. 4 also shows liners suspended in a stand-by position on the side of the back 3 which is remote from the supporting surface 2. The liners 6 may consist, for example, of a mesh or grid of flexible material having a soft surface, as is shown in FIG. 5. More particularly, the liners may consist of a woven fabric of glass fibers coated with polytetrafluoroethylene. Where the liners comprise separate carrying bars 9 having holes 10, the bars may be provided with spacing ribs 11 to facilitate the gripping of the liners. As the printed circuit boards 8 are stacked, the liners 6 can be moved from their stand-by position to their operative position between adjacent printed circuit boards by means of motor-driven coupling clamps guided in parallel. This will be effected by the means which are provided in accordance with the invention as illustrated in FIGS. 6 to 8.

Figure 6:
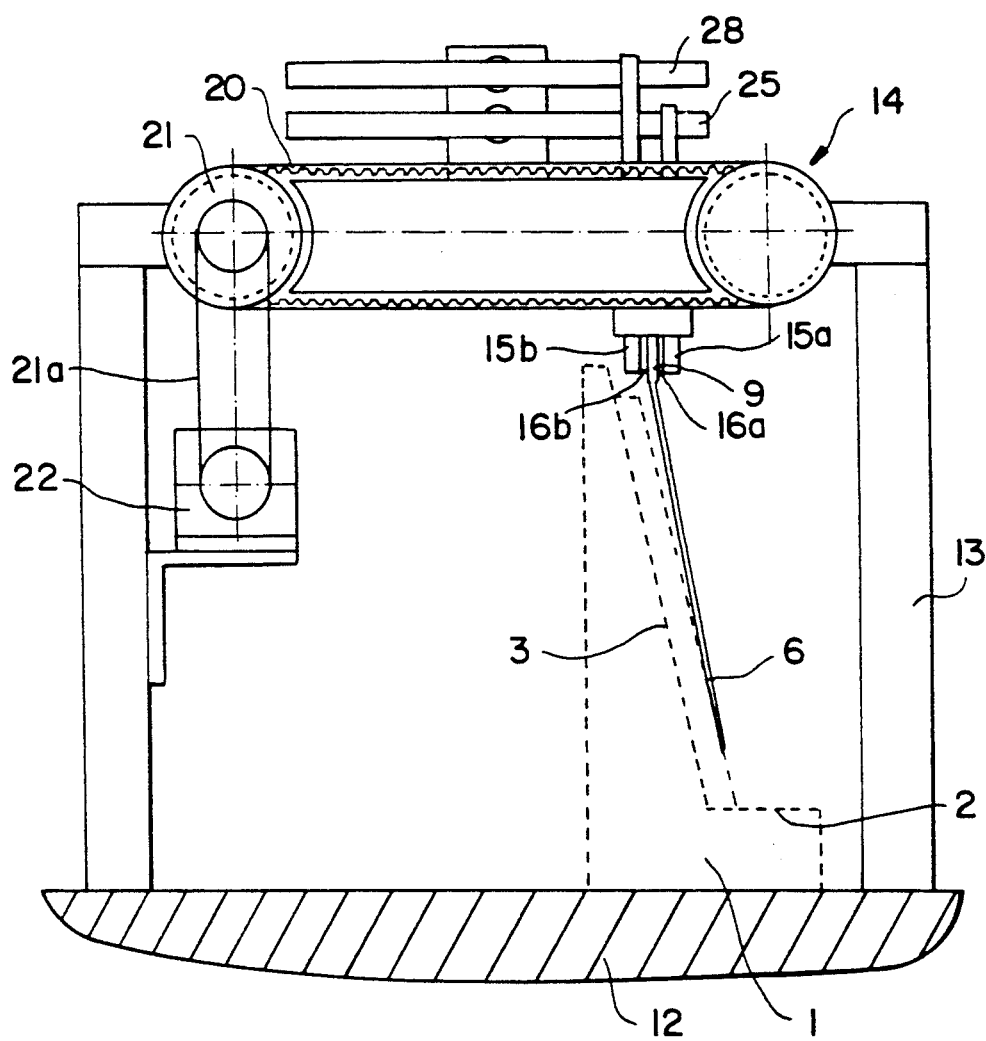
FIG. 6 is a side elevation illustrating an embodiment of the invention.

In accordance with FIGS. 6, a base frame 12 is associated with the magazine that comprises a base 1 having a supporting surface 2 and a back 3 which rises from the base 1 with a slight rearward inclination. The base frame 12 carries a split frame which has two symmetrical sub-frames 13. A belt drive 14 is mounted on each split frame 13 at its top end and comprises a belt 20 which defines an elongate hole. Two gripper arms 15a and 15b are mounted on each belt 20 and comprise gripping jaws 16a and 16b which are adapted to couple the belt 20 to the carrying bar 9 of a liner 6.

Figure 7:
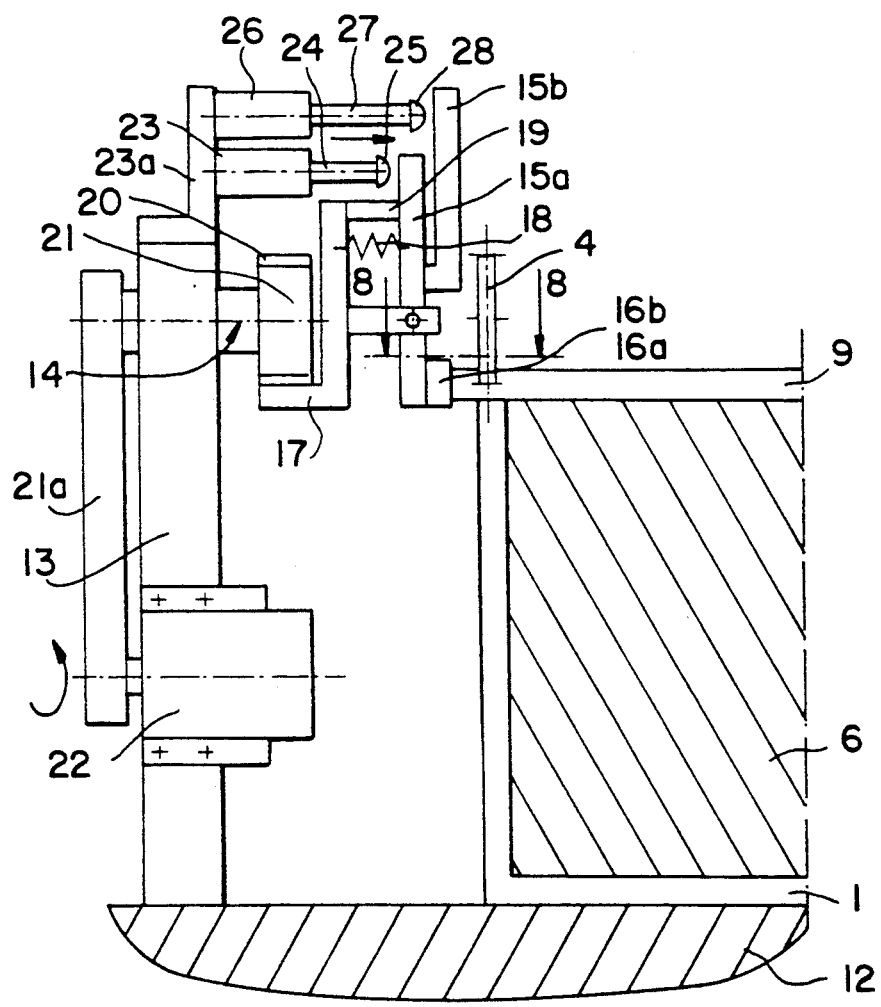
FIG. 7 is a front elevation showing the magazine of FIG. 6.
Figure 8:
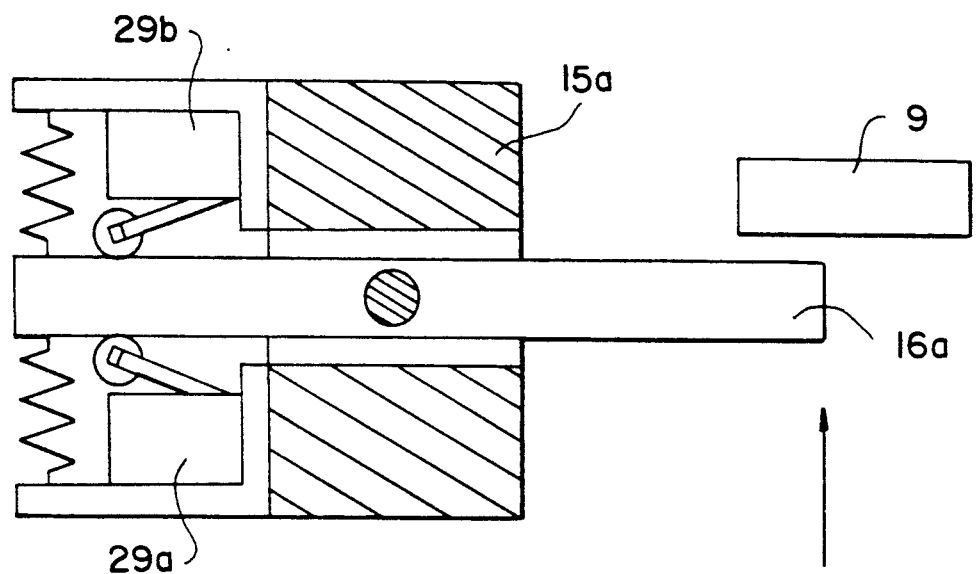
FIG. 8 illustrates a sectional view taken along the line A—A of FIG. 7.

FIG. 7 shows the elongate annular members 4, which are secured to the base 1 of the magazine and extend parallel to the belt drives 14. The gripping arms 15a and 15b are pivoted to an angle bracket 17 which is fixed to each belt 20. A spring 18 urges the gripping arms 15a and 15b against a stop 19 to assume an operative position. Each belt 20 is trained around the belt pulley 21 and a second belt pulley. The belt pulley 21 is driven from the motor 22 by means of a belt drive 21a. FIG. 7 shows also a stationary actuator 23 having a cylinder mounted on the subframe 13 by an angle bracket 23a.

The piston 24 of the cylinder 23 carries an actuating bar 25, which moves the gripping arm 15a to an inoperative position as the piston 24 is extended. A similar actuator 26 is mounted above the actuator 23 and comprises a piston 27 for advancing the actuating bar 28 for moving the gripping arm 15b to an inoperative position. The length of each of the actuating bars 25 and 28 may properly be selected so that the two gripping arms 15a and 15b can be moved to their inoperative position so that they can engage each of the liners 6 at any position in which the liner 6 may be disposed. The spring 18 urges the associated gripping arm to an operative position, in which the associated gripping jaw extends into a path which has the same shape as and laterally registers with the associated elongate annular member 4. In its inoperative position, each gripping arm and the associated gripping jaw are disposed clear of the path.

To permit each of the liners 6 to be individually moved from its stand-by position to its operative position, each liner 6 comprises a carrying bar 9 having spacing bulges 11, as is shown in FIG. 5. The bulges 11 of adjacent liners 6 are laterally offset so that a gap will always be left between the ends of adjacent carrying bars 9 of adjacent liners 6 in their stand-by position and the gripping jaws 16a and 16b can be turned into the gaps without colliding with the liner 6 which succeeds the leading liner 6 that is to be coupled to the belts 20. To ensure that the gripping arms 15a and 15b will properly be positioned as they engage the carrying bars 9, the gripping jaws 16a are pivoted to the gripping arms 15a. As is apparent from FIG. 8, the gripping jaw 16a is pivotally moved to actuate a sensor 29a. During an actuation of the gripping jaw 16a in the opposite direction it actuates the sensor 29b. The sensors 29a and 29b may be a microswitch. The response of either of the sensors 29a and 29b will cause the drive motor 22 to be de-energized so that the belt drive 14 is stopped.

The operation illustrated in FIG. 3, by which each liner 6 is moved from its stand-by position to its operative position can now be performed as will be described hereinafter. In the initial state of the magazine the belt drive 14 is operated to move the gripping arms 15a and 15b in the counter-clockwise sense. As the gripping arms 15a and 15b enter the horizontal lower course of the belt 20 before reaching the leading liner 7 in the stand-by position, the gripping arm 15b is moved to its inoperative position by means of the actuator 26. As the gripping jaw 16a pivoted to the gripping arm 15a strikes the carrying bar 9 of the leading liner 6, the sensor 29a (FIG. 8) is actuated to de-energize the motor 22 so that the belt drive 14 is stopped. The gripping arm 15b is then urged to its operative position by the spring 18 so that the carrying bar 9 of the leading liner 6 is held between the two gripping jaws 16a and 16b. Thereafter the motor 22 is energized so that the belt 20 rotates in the clockwise sense to move the leading liner 6 by means of the gripping arms 15a and 15b and gripping jaws 16a and 16b from its stand-by position to its operative position as is shown in FIG. 3. As soon as the gripping jaw 16a strikes the carrying bar 9 of a liner 6 which is in its operative position, the gripping arm 15b is pivotally moved to actuate the sensor 29b so that the motor 22 is de-energized to stop the belt drive 14. The actuators 23 and 26 (FIG. 7) are now operated to move [out] the two gripping arms 15a and 15b to their inoperative positions and to hold them in said positions while the operation of the belt drive 14 is resumed until the two gripping arms have been moved out of the horizontal lower horizontal course of the belt 20, that is, out of the space in which liners 6 are arranged in their stand-by position on the rear side of the magazine. Thereafter the springs 18 are permitted to return the gripping arms to their operative position.

The foregoing is a description enabling one of ordinary skill in the art to make and use the preferred embodiments of the present invention. It will be appreciated by those skilled in the art that there exists variations, modifications, and other equivalents to the embodiments disclosed herein. The present invention therefore is to be limited only by the scope of the appended claims.

We claim:

1. An apparatus for storing and transporting printed circuit boards, the apparatus comprising:
    a body having an upwardly facing supporting surface for supporting a plurality of stacked circuit boards and a second surface substantially perpendicular to the supporting surface;
    two spaced apart, elongate annular members secured to the body and extending in a direction substantially parallel to the supporting surface and substantially perpendicular to the second surface;
    a plurality of liners, each having two holes, wherein each of the annular members passes through a respective hole on each liner and each liner is movable along the annular members between a stand-by position in which the liner is suspended from the annular members on a first side of the second surface and an operative position in which the liner is disposed on an opposite side of the second surface and extends between two consecutive printed circuit boards supported on the supporting surface;
    two belt drives associated with respective ones of the elongate annular members, the belt drives each comprising endless belts extending parallel to the associated elongate annular members, wherein the belts are operable to rotate synchronously;
    two grippers, each pivoted to a respective one of the belts and adapted to rotate therewith on a path which intersects the liners when the liners are in the standby and operative positions;
    biasing means for urging the grippers into the paths to an operative gripper position to couple the belts to the liners; and
    stationary actuator means for moving and keeping the grippers out of the paths in an inoperative gripper position.

2. The apparatus of claim 1, wherein each of the paths has the same shape as and laterally registers with the associated one of the elongate annular members.

3. The apparatus of claim 1, wherein
    the grippers include sensing means which are actuated by a movement of the grippers to a position close to one of the liners in one of the stand-by and operative positions and
    means for arresting the belt drives in response to actuation of the sensing means by the grippers.

4. The apparatus of claim 3, wherein
    the actuators are arranged to move the grippers to the inoperative position in response to the actuation of the sensing means by the grippers.

5. The apparatus of claim 1, wherein the belt drive is reversible for moving the grippers along the paths in mutually opposite directions.

6. The apparatus of claim 1, wherein
    each of the liners is disposed adjacent to the elongate annular members with a carrying bar which intersects the paths,
    the carrying bars include projections arranged to hold adjacent ones of the liners spaced apart in the stand-by position so as to permit the grippers to extend in the operative positions between the carrying bars of the adjacent liners.

7. The apparatus of claim 6, wherein
    the projections of the carrying bars of adjacent ones of the liners in the stand-by position are spaced apart along the carrying bar.

8. The apparatus of claim 1, wherein each of the actuators comprise an actuating bar for pivotally moving the associated gripper from its operative position to its inoperative position when the gripper is in any desired position along the path.

9. An apparatus for storing and transporting printed circuit boards, the apparatus comprising:
    a body having an upwardly facing supporting surface for supporting a plurality of stacked circuit boards and a second surface substantially perpendicular to the supporting surface;
    an elongate annular member secured to the body, the elongate member extending in a direction substantially parallel to the supporting surface and substantially perpendicular to the second surface;
    a liner having a hole, wherein the annular member passes through the hole in the liner and the liner is movable along the annular member between a stand-by position in which the liner is suspended from the annular member on a first side of the second surface and an operative position in which the liner is disposed on an opposite side of the second surface and extends between two consecutive printed circuit boards supported on the supporting surface;
    a belt drive associated with the elongate annular member, the belt drive comprising an endless belt extending parallel to the associated elongate annular member wherein the belt is operable to rotate;
    a gripper pivotally disposed on the belt and adapted to rotate therewith on a path which intersects the liner when the liner is in the standby and operative positions;
    biasing means for urging the gripper into the path to an operative gripper position to couple the belt to the liner; and
    stationary actuator means for moving and keeping the gripper out of the path in an inoperative gripper position.

\* \* \* \* \*